United States Patent [19]

Kowalski

[11] Patent Number: 4,868,489
[45] Date of Patent: Sep. 19, 1989

[54] DEVICE TO DETECT THE DEPASSIVATION OF AN INTEGRATED CIRCUIT

[75] Inventor: Jacek Kowalski, Trets, France

[73] Assignee: SGS-Thomson Microelectronics, S.A., Gentilly, France

[21] Appl. No.: 212,890

[22] Filed: Jun. 29, 1987

[30] Foreign Application Priority Data

Jul. 10, 1987 [FR] France .................. 87 09792

[51] Int. Cl.$^4$ .......................................... G01R 27/26
[52] U.S. Cl. ........................ 324/61 P; 324/60 CD; 324/61 R; 357/52
[58] Field of Search ............ 324/60 R, 61 R, 61 P, 324/60 CD; 357/25, 52

[56] References Cited

U.S. PATENT DOCUMENTS

| | | |
|---|---|---|
| 3,750,018 | 7/1973 | Leone . |
| 3,801,900 | 4/1974 | Szasz . |
| 3,986,110 | 10/1976 | Overall ........................ 324/61 P |
| 4,423,371 | 12/1983 | Senturia ....................... 324/61 R |
| 4,453,126 | 6/1984 | Volgyesi ....................... 324/61 P |
| 4,510,436 | 4/1985 | Raymond ...................... 324/61 P |

FOREIGN PATENT DOCUMENTS

| | | |
|---|---|---|
| 0169941 | 2/1986 | European Pat. Off. . |
| 0221351 | 10/1987 | European Pat. Off. . |
| 3123023 | 12/1982 | Fed. Rep. of Germany . |
| 2164316 | 7/1973 | France . |

*Primary Examiner*—Reinhard J. Eisenzopf
*Assistant Examiner*—Jose M. Solis
*Attorney, Agent, or Firm*—Roland Plottel

[57] ABSTRACT

The depassivation of an integrated circuit is detected by using the fact that the passivation coat which covers this circuit participates in the coupling capacitances that exist between parallel metallized lines made on its surface. The variation in one of these capacitances, resulting from depassivation, leads to a modification of the dielectrical induction of a voltage step, emitted on one line, in another line. The resulting variation in the induced voltage is used to produce a logic signal that reveals this depassivation. This logic signal can be used to neutralize the functioning of the integrating circuit to be protected.

9 Claims, 1 Drawing Sheet

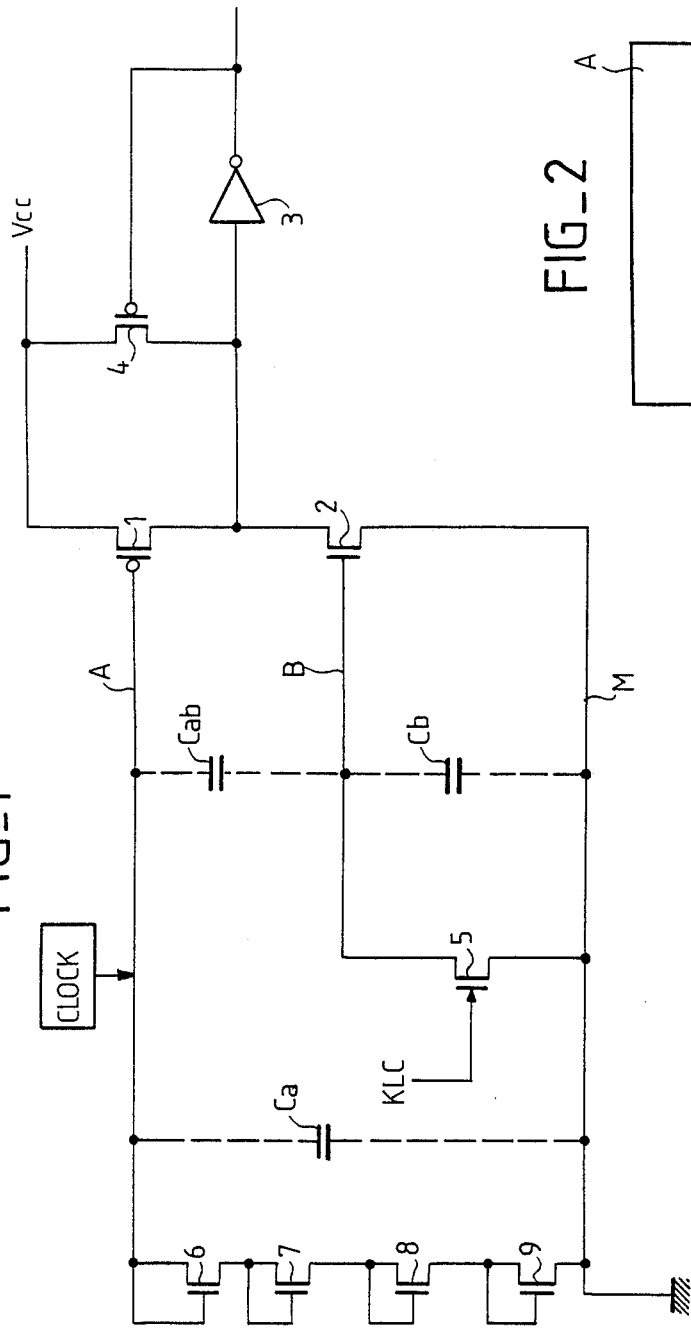
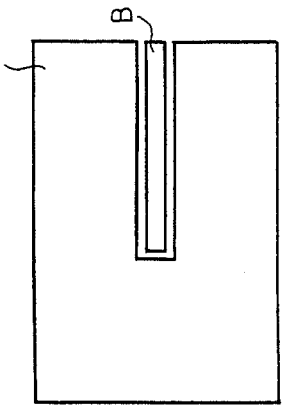
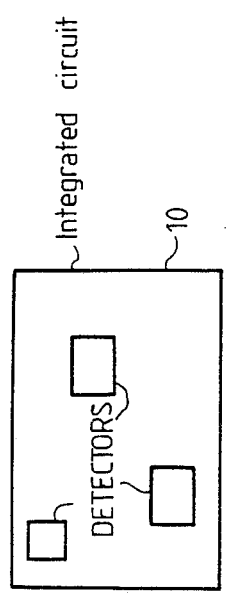

DEVICE TO DETECT THE DEPASSIVATION OF AN INTEGRATED CIRCUIT

BACKGROUND OF THE INVENTION

1. Field of the Invention

An object of the present invention a device to detect the depassivation of an integrated circuit. In semiconductor technology, it relates more particularly to the field of electronic credit cards where electronic integrated circuits are used, to keep the accounts of individual bank balances up to date and/or, also, as keys providing access, through a recorded secret code, to bank machines (for example automatic money tills).

2. Description of the Prior Art

One of the biggest problems encountered with respect to integrated circuits incorporated in electronic credit cards relates to the risk of fraud. In view of the confidence placed in this new means of financial transaction, the inviolability of these cards should be ensured under all circumstances. Thus, for example, systems have been invented to prevent the use of the d.c. power supply circuit of an electronic credit card incorporating integrated circuits of this type to try and discover the secret codes which such a card may contain. To this end, the voltage, usable inside the integrated circuit in order to bias it, has been made independent of the supply voltage. Furthermore, the output circuits of these integrated circuits have been modified so that this power supply does not put through different currents depending on whether the logic states read in the memory of the integrated circuit and transmitted are logic states "1" or logic states "0". Following another line of thinking, the architecture of the contact terminals which can be used for the programming of these integrated circuits has been modified so that, after this programming, any action taken at these terminals is ineffective. However, the imagination of fraudulent persons knows no bounds.

In fact, it has been realized that the operation of an integrated circuit can be known and understood when the passivation layer that covers this circuit after its manufacture has been removed, and when memory points of its memory are selected while, at the same time, observing the passage of the current through the connections of this integrated circuit with an electron microscope. Although this method of fraud is very expensive, protection against it is becoming a necessity.

It is an object of the invention to cope with this particular problem of fraud. To resolve this problem, the invention uses the fact that the capacitance displayed by a line, a connection of this integrated circuit, with respect to another line of this integrated circuit or with respect to a general ground is modified by the removal of this passivation layer. For this line capacitance is far greater when the passivation exists and, on the contrary, it is weaker when this passivation has been removed. On the basis of this observation, in the invention, a detector comprising a critical triggering threshold is connected to the terminals of a line with a capacitance of this type, this critical threshold being set in between the electrical states which the considered line is liable to take before and after the depassivating operation. It is possible to use lines specifically made for this purpose. It is also possible to use lines already existing in the integrated circuit block, lines of the memory block for example. Besides, since the depassivation detector may be very small (in one example it has six transistors), it is also possible to place a number of these detectors at several places on the integrated circuit so as to prevent these detectors from being neutralized by an electrode brought in from outside. If there are too many of these transistors, the number of neutralizing electrodes will be too great and will mask the field of the electron microscope.

The invention therefore concerns a device to detect the depassivation of an integrated circuit, comprising means to detect a variation in a line capacitance resulting from this depassivation.

BRIEF DESCRIPTION OF THE DRAWINGS

The invention will be better understood from the following description and the accompanying drawings which are given purely as an indication and in no way restrict the scope of the invention. Of these figures:

FIG. 1 shows an example of a depassivation detection device according to the invention;

FIG. 2 shows a special form of specific lines used in this detection device; and FIG. 3 shows an integrated circuit with several detection devices of FIG. 1.

DESCRIPTION OF A PREFERRED EMBODIMENT

FIG. 1 shows a depassivation detection device according to the invention. This device has two, preferably metallized lines, A and B. These lines each have, with respect to a general ground M, capacitances Ca and Cb respectively, resulting from the fact that they are physically opposite to each other. The lines A and B further have, between them, a capacitance Cab resulting from their proximity to each other. If a signal is applied, for example a voltage step, to one of the lines, for example the line A, this signal is transmitted through the capacitances Cab and Cb to the line B. Here, the capacitances Cab and Cb form a capacitive divider bridge. This bridge powers the line B which would otherwise be considered to be electrically ungrounded. If Va is the height of the voltage step, the value of the voltage induced on the line B is equal to:

$$Vb = Va. \; Cab/(Cab+Cb).$$

When the passivation is present, the capacitance Cab equals Cab1 and the voltage Vb becomes Vb1 such that:

$$Vb1 = Va. \; Cab1/(Cab1+Cb).$$

On the contrary, without the passivation, Cab equals Cab2 and this voltage becomes Vb2 such that:

$$Vb2 = Va. \; Cab2/(Cab2+Cb).$$

Taking Cb to be equal to k.Cab2 and Cab1 to be equal to n.Cab2, the variation DVb of Vb between one state and another can be written:

$$DVb = Va.k(n-1)/(n+k)(1+k).$$

For the detector to work properly, it is necessary to obtain the highest possible DVb. Mathematical analysis shows that, in this case, the coefficient k should be as small as possible and that the coefficient n should be as great as possible. The coefficient k depends mainly on the electrical scheme of the connections (FIG. 2) and it is fixed so as to have a voltage Vb1 above a threshold, even for the worst case (of a voltage step of only four volts, for example) when the circuit is still passivated. At best, the coefficient k may be equal to about 3. In practice, in view of manufacturing variance, a greater coefficient k is chosen. The coefficient n, for its part, depends mainly on the dielectrical constant of the passivation layer. But in practice n, for which the greatest possible value is desired, will always be smaller than 3.

In a numerical example, with $k=10$ and $n=2.5$, a computation can be made of what happens to the voltages Vb1 and Vb2 respectively before and after depassivation. The computation is done each time taking the worst case, namely a case when the value of the voltage step is low (4 volts) in the former instance and when this value of the voltage step is high (6 volts) in the latter instance respectively. With this example, the values of these voltages are respectively $Vb1=0.8$ volts and $Vb2=0.55$ volts. This difference can be detected by a detection circuit comprising essentially a comparator. There can be a very great number of approaches.

One of the simplest of these is shown in FIG. 1. The detection circuit has a P-channel transistor 1 connected in series with an N-channel transistor 2 between the electrical power supply Vcc of the integrated circuit and the ground M. The lines A and B are respectively connected to the gates of the transistors 1 and 2. An inverter 3 connected to the mid-point of the transistors 1 and 2 inverts the signal available at this midpoint. A P-channel transistor 4 is mounted in negative feedback on this inverter between the input of this inverter and the supply voltage Vcc. The circuit 3-4 is a bistable circuit. Preferably, the voltage step CLK applied to the line A is applied at the same time as a complementary polarity step KLC to the gate of an N-channel transistor 5 mounted in parallel between the line B and the ground M. When CLK equals zero, the transistor 5 made conductive by KLC forces the voltage on the line B to zero. The transistor 1 is then conductive and the transistor 2 is then off so that a signal zero is available at the output of the inverter 3. When the voltage step is applied, the signal CLK goes to the state one and the signal KLC goes to the state zero. The transistor 5 goes to the off state while the voltage Vb is induced on the line B.

If the passivation is still present, the voltage Vb becomes Vb1 (in one example 0.8 volts). This voltage is higher than the conduction threshold of the transistor 2 so that this transistor is on and forces the input of the inverter 3 to zero. Consequently, the bistable circuit 3-4 changes polarity: its output goes to one. On the contrary, if the passivation has been removed, the voltage Vb2 (0.55 volts) is lower than the conduction thresholds of the transistor 2. This transistor 2 stays off while the transistor 1, which receives a positive voltage step at its gate, goes off. The midpoint of the two transistors 1 and 2, which is not forced to a particular potential, is then kept in its preceding state by the bistable circuit 3-4. The output of the inverter 3 remains at zero. It therefore does not change its state. It is then observed that the simplest use of the detector according to the invention lies in making a clock signal CLK transit through the depassivation detection circuit. If the passivation is still present on top of the circuit, the clock signal is transmitted. If it is absent, this clock signal is stifled.

Reference has been made above to the worst possible cases resulting from faulty supply to the integrated circuit to be protected. In particular, if the electrical supply is excessive at the instant of depassivation, the voltage induced on the line B may be proportionately excessive and may be sufficient to trigger the transistor 2. However, this voltage is restricted by placing a certain number of series-connected diodes such as 6 to 9 in parallel between the line A and the ground M. The addition of the conduction thresholds of these diodes limits the voltage that can be imposed on the line A. In this case, the depassivation is detected independently of the value of Vcc.

FIG. 2 shows a preferred embodiment of specific lines A and B to be implanted into the integrated circuit. To increase the coefficient k, which is favorable to an increase in DVb, the metallized line B should be surrounded by the metallized line A. To this same end, the surface of the line A is increased to the maximum, and a minimum gap is made between the two lines.

FIG. 3 shows an integrated circuit 10 with several detector devices of FIG. 1.

What is claimed is:

1. A device to detect the depassivation of an integrated circuit to be incorporated in a credit card, said integrated circuit comprising a first line and a second line, said lines being laid between an upper face of said integrated circuit and a passivation layer which passivates said integrated circuit, and means to detect a variation in a line capacitance of said lines resulting from this depassivation, the detection means comprising said two lines which are mutually coupled capacitively and a ground circuit coupled capacitively to said second line by being placed in opposition with this second line, the passivation capacitance constituting, with an opposition capacitance, a capacitive dividing bridge established between these two lines and the ground, said opposition capacitance resulting from the opposition of said second line with said ground.

2. A device according to claim 1 wherein the detecting means comprise a bistable comparator connected to the midpoint of the dividing bridge.

3. A device according to either of claims 1 or 2 wherein the first line is coiled around the second line.

4. A device according to either of claims 1 or 2 wherein the first line is connected to the ground by a clipper circuit.

5. A device according to claim 4 wherein the clipper circuit comprises a set of series connected diodes.

6. A device according to either of claims 1 or 2 wherein the lines are metallised.

7. A device according to either of claims 1 or 2 connected for validating the transmission of a clock signal to said integrated circuit.

8. An integrated circuit provided with several detectors according to claim 1 or 2.

9. A device according to either of claims 1 or 2 wherein the first line spreads over a larger surface on the integrated circuit than the second line.

* * * * *

UNITED STATES PATENT OFFICE
CERTIFICATE OF CORRECTION

Patent No. 4,868,489  Dated Sep. 19, 1989

Inventor(s) Jacek Kowalski

It is certified that error appears in the above-identified patent and that said Letters Patent is hereby corrected as shown below:

Title page, left column, after "[22] Filed: Jun. 29," change "1987" to -- 1988 --.

Signed and Sealed this

Eighteenth Day of June, 1991

Attest:

HARRY F. MANBECK, JR.

*Attesting Officer*  *Commissioner of Patents and Trademarks*